United States Patent [19]

Miyata et al.

[11] Patent Number: 4,696,838

[45] Date of Patent: Sep. 29, 1987

[54] METHOD OF FORMING BUILT-UP FILM OF FLUORINATED ALIPHATIC COMPOUND ON SUBSTRATE SURFACE

[75] Inventors: Seizo Miyata; Hidenari Nakahama; Takeshi Kasuga, all of Tokyo, Japan

[73] Assignee: Central Glass Company, Limited, Ube, Japan

[21] Appl. No.: 874,847

[22] Filed: Jun. 16, 1986

[30] Foreign Application Priority Data

Jun. 26, 1985 [JP] Japan ................. 60-137850

[51] Int. Cl.$^4$ ................. B05D 1/36
[52] U.S. Cl. ................. 427/407.2; 264/298; 427/385.5; 427/393.5; 427/393.6; 427/430.1; 427/443.2
[58] Field of Search ............. 427/443.2, 385.5, 393.5, 427/430.1, 389.7, 393.6, 407.2; 264/298

[56] References Cited

U.S. PATENT DOCUMENTS 4,276,350 6/1981 Franz ................. 428/410
4,311,764 1/1982 Franz ................. 428/423.1

OTHER PUBLICATIONS

John H. Clint et al, Interaction Energies Between Layers of Alkyl and Partially Fluorinated Alkyl Chains in Langmuir–Blodgett Multilayers, Journal of Colloid and Interface Science, vol. 47, No. 1, Apr. 1974, pp. 172–185.

*Primary Examiner*—Thurman K. Page
*Attorney, Agent, or Firm*—Fleit, Jacobson, Cohn & Price

[57] ABSTRACT

Using the Langmuir–Blodgett's technique and a compound represented by the general formula $CF_3(CF_2)_n(CH_2)_m-X$, wherein X is a hydrophilic group, preferably —COOH, n is from 5 to 20 and m is from 0 to 10, a firm built-up film having a desired number of monomolecular layers can surely be formed on a solid substrate surface by spreading a monomolecular film of the fluorinated compound on an aqueous phase containing trivalent metal ions. In the obtained built-up film the $CF_3$-terminated molecules are well oriented in the direction of the thickness of the film. The built-up film fully exhibits extreme hydrophobicity, high insulation, low refraction and other properties characteristic of the fluorine-containing compound.

7 Claims, No Drawings

2

METHOD OF FORMING BUILT-UP FILM OF FLUORINATED ALIPHATIC COMPOUND ON SUBSTRATE SURFACE

BACKGROUND OF THE INVENTION

This invention relates to a method of forming a built-up film, i.e. a film made up of a desired number of monomolecular layers, of a fluorinated aliphatic compound having a hydrophilic group at one terminal on a solid substrate surface by using the Langmuir-Blodgett's technique.

Extensive research and development work has been pursued concerning organic fluorine-containing compounds and fluoro-polymers to utilize their characteristic properties such as hydrophobicity, lubricativeness and high resistance to chemicals in coating or treating various solid surfaces. With the recent advancement of optoelectronics, low indices of refractin of organic fluorine-containing materials are also attracting keen attention.

Polytetrafluoroethylene resin coatings are used for very wide purposes, and some different kinds of fluorine-containing organic coating materials are used for special purposes. For example, a coating material that utilizes coupling reaction of a fluorosilane is used for modification of glass surfaces, and paints containing a perfluorocarboxylic acid are also in practical use. In general, conventinal fluorine-containing organic coatings are formed by application of solution, suspension or paste of the coating materials.

As for coating films on electrical, electronical or optical materials, generally it is desirable to reduce the thickness of the coating films as much as possible from the viewpoint of effectively utilizing the electrical or optical properties inherent to the base materials. In the conventional fluorine-containing organic coatings formed by liquid coating methods there are limits to the reduction of the coating film thickness. Besides, conventional fluorine-containing organic coating films are not always satisfactory in the ability to shield the base material surfaces from intrusion of moisture.

Meanwhile, studies have been made on the formation of built-up films of organic compounds on solid substrate surfaces by using the Langmuir-Blodgett's technique. For example, Clint et al., J. Colloid and Interface Sci., 47, No. 1, 172–185(1974) deal with Langmuir-Blodgett multilayers of cadmium salts of long chain fatty acids and their partially fluorinated derivatives.

In general it is difficult to form built-up films of perfluorohydrocarbons by the usual method because the cohesive energy between adjacent molecules becomes considerably low by the influence of the introduced fluorine. In the cases of fluorohydrocarbons which retain a relatively long hydrocarbon chain, it is possible to obtain built-up films by using the Langmuir-Blodgett's technique. However, the obtained built-up films are not satisfactory in respect of the effects of the introduction of fluorine atoms, such as water repellency, low reflectance, low refraction and high withstand voltage, because of shortness of the fluorocarbon chain compared with the hydrocarbon chain.

SUMMARY OF THE INVENTION

Basically it is an object of the present invention to provide a desirably thin coating film of a fluorinated aliphatic compound, which film is firm and stable and fully exhibits the properties characteristic of the fluorinated compound.

More particularly, it is an object of the invention to provide a method of forming a built-up film of a fluorinated aliphatic compound having a hydrophilic group at one terminal on a solid substrate surface with good orientation of the molecules in each monomolecular layer of the film in the direction of the thickness of the film.

A method according to the invention for forming such a built-up film comprises the steps of spreading a monomolecular film of a compound represented by the general formula $CF_3(CF_2)_n(CH_2)_m-X$, wherein X represents a hydrophilic group, n is an integer from 5 to 20, and m is 0 or an integer from 1 to 10, on the surface of an aqueous phase which comprises trivalent metal ions, transferring the monomolecular film onto a surface of a solid substrate by the Langmuir-Blodgett's technique, and repeatedly transferring the monomolecular film onto the surface of the monomolecular layer or layers already existing on the substrate surface by the Langmuir-Blodgett's technique.

A typical and preferred example of the hydrophilic group $-X$ in the above general formula is $-COOH$.

We have attained full success in forming a very good built-up film of a fluorinated aliphatic comound by first determining the length of the fluorocarbon chain having a terminal $-CF_3$ group so as to provide sufficient hydrophobicity and attaching a hydrophilic group at the opposite terminal and then using an aqueous phase containing trivalent metal ions in the Langmuir-Blodgett method.

With respect to organic compounds represented by fatty acids, it is well known that monomolecular films of metal salts are structurally more stable than the monomolecular films of free acids and that for stabilization divalent metal ions are more effective than monovalent metal ions. Especially, $Cd^{2+}$ has been accepted as superior. Trivalent metal ions serve the function of very strongly stabilizing organic monomolecular films spread on the surface of water, but until now employment of trivalent metal ions has been avoided because the stabilized monomolecular film possesses excessively high rigidity and therefore cannot easily be transferred onto a solid substrate surface and built up thereon. However, we have found and confirmed that, in the cases of forming built-up films of the fluorinated compounds represented by the above general formula, the presence of trivalent metal ions in the aqueous phase is indispensable for firm stabilization of the monomolecular film on the water surface and is not obstructive to the operation to build up a multi-layer film on a substrate surface.

In forming a fluorine-containing organic coating film by the method according to the invention it is possible to control the film thickness to the order of the molecular chain length since the total number of the monomolecular layers in the built-up film is arbitrarily variable. Even a coating film consisting of a single monomolecular layer can be formed by the same method. That is, an ultra-thin coating film of a precisely controlled thickness can easily be formed by this method. In the obtained film the molecules in each monomolecular layer are very well oriented in the thickness direction, so that $-CF_3$ groups are distributed uniformly and very densely over the entire area of the film. Accordingly this coating film is excellent in chemical resistance and waterproof or water-repellent property.

In the present invention there is no particular restriction to the material of the solid substrate on which a built-up film is to be formed. Both inorganic substrate materials, including metallic and nonmetallic materials, and organic substrate materials can be used.

A built-up film formed by the method according to the invention serves as a fluorine-containing coating film which is firm and stable and fully exhibits the characteristic properties of the employed fluorine-containing compound, such as extreme hydrophobicity, excellent resistance to chemicals and weathering, excellent lubricativeness, good electrical insulation and voltage withstanding, low refraction, and low reflection. Accordingly this invention is useful for wide purposes including protective coatings in electric and electronic devices including semiconductor devices, reflection reducing coatings on transparent materials which may be either glass or plastics, manufacture of optical plane waveguides and other types of low refraction optical devices or materials, and surface modifying coatings for biomaterials.

DESCRIPTION OF THE PREFERRED EMBODIMENTS

In the present invention the film forming material is selected from a group of fluorinated aliphatic compounds represented by the general formula $CF_3(CF_2)_n(CH_2)_m-X$ as defined hereinbefore. Examples of the hydrophilic group X in the general formula are $-COOH$, $-CH_2OH$, $-CN$, $-CH_2NH_2$, $-CONH_2$, $-CH=NOH$, $-CH_2COCH_3$, $-NHCONH_2$, $-NHCOCH_3$, $-OCOCH_3$, $-SO_3^-$, $-OSO_3^-$, $-NR_3$ (R is an alkyl group), $-CH_2OCH_3$ and $-COOCH_3$. Among these hydrophilic groups, $-COOH$ is preferred in this invention. Still alternatively, the hydrophilic group X may be one having a double bond such as $-COOCH=CH_2$, $-OCOCH=CH_2$ or $-OCOC(CH_3)=CH_2$. When the film forming material is unsaturated at the terminal group it is possible to polymerize the film forming material in the state of monomolecular film or multilayers to thereby obtain a film which features enhanced toughness and impact resistance. The polymerization may be accomplished while the monomer lies on the water surface as a monomolecular film by using a water soluble initiator or after forming a built-up film on a substrate surface by a photopolymerization method using UV rays or ionizing radiation.

The aqueous phase on which a monomolecular film is to be spread needs to contain trivalent metal ions such as $Al^{3+}$, $Fe^{3+}$, $Ni^{3+}$, $Co^{3+}$, $Cr^{3+}$ or $Ce^{3+}$. In general a suitable range of the concentration of the trivalent metal ions is from $1 \times 10^{-7}$ to $1 \times 10^{-3}$ mol/liter.

The selected film forming compound is dissolved in a suitable volatile solvent such as, for example, benzene, hexane or chloroform to obtain a suitably dilute solution. In a well known manner the solution is gently dropped on the surface of the aqueous phase containing trivalent metal ions to thereby spread a monomolecular film of the selected fluorine-containing compound on the water surface. By lateral compression the monomolecular film is maintained at a predetermined surface pressure, which is usually 10-50 dyne/cm. In that state a clean solid substrate held perpendicular to the water surface is vertically submerged in the aqueous phase through the plane of the monomolecular film and then vertically pulled up through the same plane to thereby transfer the monomolecular film onto the substrate surface. By repeating this procedure a built-up film having a desired number of monomolecular layers can be formed on the substrate. Also it is possible to cause cohesion of the monomolecular film to a solid substrate surface held parallel to the water surface.

The material of the substrate is not particularly specified. The material may be glass, metal, semiconductor; ceramics, insulating oxide, plastics or rubber. In any case the substrate should have smooth and sufficiently clean surfaces.

The invention will further be illustrated by the following nonlimitative examples.

EXAMPLES 1-4

In Example 1, a partially fluorinated fatty acid $CF_3(CF_2)_7(CH_2)_2COOH$ was employed as a preferred example of the compounds represented by the general formula given hereinbefore.

The fluorinated fatty acid was dissolved in chloroform to obtain a spreading solution in which the concentration of the solute was $3 \times 10^{-3}$ mol/l. Separately an aqueous phase was prepared by dissolving $K_2Al_2(SO_4)_4$, which was chosen as the source of trivalent metal ions, in water in a concentration of $5 \times 10^{-5}$ mol/l together with $2 \times 10^{-6}$ mol/l of $KHCO_3$ used as a pH controller.

A small amount of the spreading solution was spread on the aqueous phase containing $Al^{3+}$ ions so as to form a monomolecular film of the fluorinated fatty acid salt, and the monomolecular film was compressed so as to maintain the surface pressure of the film at about 27-31 dynes/cm. In that state, the monomolecular film was transferred onto a cleaned glass substrate, which was a microscope slide 1.2-1.5 mm in thickness and 76 mm×26 mm in widths, by the Langmuir-Blodgett's technique. On several glass substrates the transferred monomolecular film was left in that state. On another group of glass substrates the Langmuir-Blodgett operation was repeated to form a built-up film consisting of eleven monomolecular layers. Besides, a built-up film having 29 monomolecular layers was formed by the same method as a sample for measurement of the refractive index. In every case the glass substrate was moved vertically through the plane of the monomolecular film spread on the aqueous phase.

To prepare samples for measurement of electrical properties of the monomolecular and built-up films, some of the substrates were precedingly coated with a thin film of aluminum by a vapor deposition technique, and subsequently a counter-electrode was deposited on the monomolecular or built-up film on each of these substrates.

In Examples 2, 3 and 4, $CF_3(CF_2)_7(CH_2)_4COOH$, $CF_3(CF_2)_7COOH$ and $CF_3(CF_2)_9COOH$ were used, respectively, as the film forming material. In each of Examples 2-4 a monomolecular film or a built-up film was formed on each glass substrate by the same method and under the same condition as in Example 1.

For comparison, stearic acid $CH_3(CH_2)_{16}COOH$ too was used as the film forming material. The following table shows several items of the properties of the thin films formed in Examples 1-4 and the films formed by using stearic acid for comparison.

The conductivity was calculated from the current-voltage relation examined by using a saw-tooth waveform current. The withstand voltage refers to a shortcircuit voltage measured by using a saw-tooth waveform voltage. The critical surface tension was calculated from Zisman plot. The refractive index was measured with an automatic ellipsometer.

| Film Forming Material | Degree of Build-up (layers) | Electric Conductivity ($10^{-15}\Omega^{-1}cm^{-1}$) | Withstand Voltage (V) | Critical Surface Tension (dyne/cm) | Refractive Index (for 29 layers) |
|---|---|---|---|---|---|
| Ex. 1 | 1 | 8.0 | 6.0 | 6.0 | 1.326 |
| $CF_3(CF_2)_7(CH_2)_2$—COOH | 11 | 1.2 | | 6.0 | |
| Ex. 2 | 1 | 9.0 | 6.0 | 6.0 | 1.328 |
| $CF_3(CF_2)_7(CH_2)_4$—COOH | 11 | 1.7 | | 6.0 | |
| Ex. 3 | 1 | 2.4 | 6.0 | 6.0 | 1.308 |
| $CF_3(CF_2)_7COOH$ | 11 | 0.9 | | 6.0 | |
| Ex. 4 | 1 | 2.0 | 6.0 | 6.0 | 1.302 |
| $CF_3(CF_2)_9COOH$ | 11 | 0.8 | | 6.0 | |
| $CH_3(CH_2)_{16}COOH$ | 1 | 27.0 | 2.8 | 24.0 | 1.462 |
| | 11 | 6.0 | | 24.0 | |

The conductivity values in the table indicate that the fluorine-containing thin films formed in Examples 1–4 were all insulators. The higher value of the withstanding voltage of these films than the value of the film formed by using stearic acid is demonstrative of an important merit of the present invention. The critical surface tension value measured on the films formed in Examples is nearly equal to that of —$CF_3$. This fact evidences very good orientation of the $CF_3$-terminated molecules in each of these films in the thickness direction. The refractive indices of the fluorine-containing films were as low as can be expected from the low value of atomic refraction of fluorine. This is indicative of usefulness of built-up films formed by the method according to the invention as low refraction films.

COMPARATIVE EXAMPLES

Alternately using the four kinds of the fluorinated fatty acids mentioned in the foregoing examples, the Langmuir-Blodgett build-up process described in Example 1 was repeated except that $3\times10^{-5}$ mol/l of either $BaCl_2$ or $CdCl_2$ was dissolved in the aqueous phase as the source of divalent metal ions in place of the trivalent metal ion source used in Examples.

When either of $CF_3(CF_2)_7COOH$ and $CF_3(CF_2)_9COOH$ was used it was impossible to transfer the monomolecular film spread on the water surface onto the glass substrate. When $CF_3(CF_2)_7(CH_2)_2COOH$ was used it was possible to transfer a single monomolecular film from the water surface onto the glass substrate, but it was impossible to build up even another monomolecular layer on the firstly transferred film. When $CF_3(CF_2)_7(CH_2)_4COOH$ was used it was possible to form a built-up film having two monomolecular films on the glass substrate, but the obtained built-up film was inferior in mechanical strength.

What is claimed is:

1. A method of forming a built-up film of a fluorinated aliphatic compound having a hydrophilic group at one terminal on a solid substrate surface, the method comprising the steps of:

spreading a monomolecular film of a compound represented by the general formula $CF_3(CF_2)_n(CH_2)_m$—X, wherein X represents a hydrophilic group, n is an integer from 5 to 20 and m is 0 or an integer from 1 to 10, on the surface of an aqueous phase which comprises trivalent metal ions;

transferring said monomolecular film onto a solid substrate surface by the Langmuir-Blodgett's technique; and repeatedly transferring the monomolecular film onto the surface of the monomolecular layer or layers already existing on the substrate surface by the Langmuir-Blodgett's technique.

2. A method according to claim 1, wherein the concentration of said trivalent metal ions in said aqueous phase is in the range from $1\times10^{-7}$ to $1\times10^{-3}$ mol/liter.

3. A method according to claim 1, wherein said hydrophilic group is selected from the group consisting of —COOH, —$CH_2OH$, —CN, —$CH_2NH_2$, —$CONH_2$, —CH=NOH, —$CH_2COCH_3$, —$NHCONH_2$, —NHCOCH$_3$, —OCOCH$_3$, —SO$_3^-$, —OSO$_3^-$, —CH$_2$OCH$_3$, —COOCH$_3$ and —NR$_3$, wherein R represents an alkyl group.

4. A method according to claim 1, wherein said hydrophilic group is selected from the group consisting of —COOCH=CH$_2$, —OCOCH=CH$_2$ and —O-COC(CH$_3$)=CH$_2$.

5. A method according to claim 1, wherein said compound is selected from the group consisting of $CF_3(CF_2)_7(CH_2)_2COOH$, $CF_3(CF_2)_7(CH_2)_4COOH$, $CF_3(CF_2)_7COOH$ and $CF_3(CF_2)_9COOH$.

6. A method according to claim 1, wherein the material of said substrate is an inorganic material.

7. A method according to claim 1, wherein the material of said substrate is an organic material.

* * * * *